United States Patent [19]

Hagiwara et al.

[11] Patent Number: 4,865,954
[45] Date of Patent: Sep. 12, 1989

[54] PROCESS FOR FORMATION OF METALLIC RELIEF

[75] Inventors: Yoshichi Hagiwara; Naoya Kimura; Kenji Emori, all of Sagamihara, Japan

[73] Assignee: Minnesota Mining and Manufacturing Company, St. Paul, Minn.

[21] Appl. No.: 7,332

[22] Filed: Jan. 27, 1987

[30] Foreign Application Priority Data

Jan. 30, 1986 [JP] Japan .................................. 61-18538

[51] Int. Cl.⁴ ........................... G03C 5/00; G03C 5/10
[52] U.S. Cl. ................................... 430/323; 430/329; 430/395
[58] Field of Search ............... 430/313, 318, 323, 329, 430/320, 395, 322

[56] References Cited

U.S. PATENT DOCUMENTS 4,379,833  4/1983  Canavello et al. .................. 430/325

FOREIGN PATENT DOCUMENTS 8601914  3/1986  PCT Int'l Appl. .................. 430/313

Primary Examiner—Jose G. Dees
Attorney, Agent, or Firm—Donald M. Sell; Walter N. Kirn; Adonis A. Neblett

[57] ABSTRACT

The present invention provides a method for forming a metal image in which a resist film is provided at an image portion and then etching processing is performed to thereby form the metal image comprising the steps of: (1) forming an image comprised of concave surface portions on a metal surface; (2) forming a resist film on the metal surface; and (3) exposing the resist film to such an extent that at the concave portions of the resist film is not made wholly soluble.

2 Claims, 1 Drawing Sheet

PROCESS FOR FORMATION OF METALLIC RELIEF

FIELD OF INVENTION

The present invention relates to a metal image forming method through an etching process, and particularly relates to a metal image forming method which can be efficiently performed at a reduced cost.

BACKGROUND ART

In the conventional metal image forming technique by way of an etching method, a resist film is formed in the form of an image on a metal surface through a screen printing method or a photoresist method, and then an etching process is performed.

Through the screen printing method or the photoresist method, however, a highly accurate image cannot be formed unless a substrate is once stopped in the step of forming the resist film so that screen printing or exposure is effected onto the substrate through an original image. Accordingly, the manufacturing cannot be achieved efficiently, which results in an increase in manufacturing cost.

The present invention provides a method for forming a metal image which avoids the above problems.

DISCLOSURE OF THE INVENTION

The present invention, provides a method for forming a metal image in which a resist film is provided at an image portion and then etching processing is performed to thereby form the metal image comprising the steps of:

(i) forming an image comprised of concave surface portions on a metal surface;
(ii) forming a resist film on the metal surface;
(iii) exposing the resist film to such an extent that at the concave portions of the resist film it is not made wholly soluble;
(iv) removing the soluble portions of the resist film to thereby selectively form the resist film at the image portion; and
(v) processing the exposed metal portions through etching and removing the resist film at the image portion.

The formation of an image composed of concave surface portions on a metal surface is preferable to be performed by means of embossing processing, as continuous processing can be affected.

DETAILED DESCRIPTION

The selective formation of the resist film in the concave portions, which is an important point of the present invention, is carried out such that after application of the resist to the whole metal surface, the resist is exposed to light for a short time, and the resist is made soluble by the exposure is dissolved away.

The time of exposure depends on the kind of a resist material, the drying conditions, the developing conditions, the thickness of the applied resist, the surface state, the quality or the like of the metal material, etc., and, as such, cannot be generally defined. In short, it is important that the exposure is effected for a time long enough to make the resist portions soluble at the projection portions (where the resist film is thin).

Referring to FIGS. 1(a) through 1(h) the method of the present invention will be described, by way of example, by describing the manufacturing of an anisotropic electrically-conductive (hereinafter simply referred to as "conductive") adhesive member. First, a parting film 3 supplied with an adhesive agent 2 is laminated onto a prepared metal foil 1 (FIG. 1(b)).

Figure 1A:
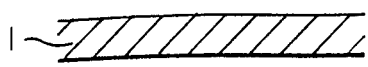
FIGS. 1(a)–(h) are schematic transverse cross-sectional views of the steps of the metal imaging process of the present invention.
Figure 1B:
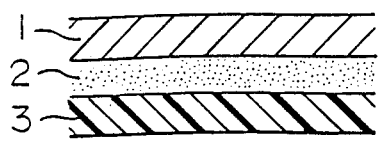
Figure 1C:
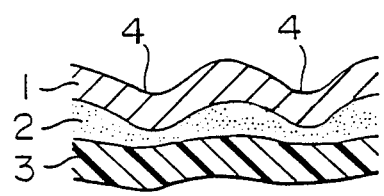
Figure 1D:
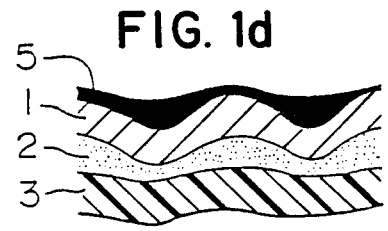
Figure 1E:
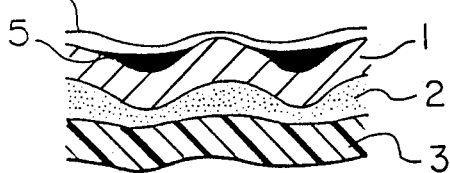
Figure 1F:
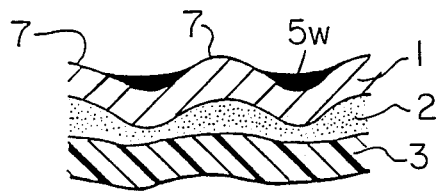
Figure 1G:
Figure 1H:

The laminated metal foil 1 is embossed to provide a number of fine concave portions 4 on a surface of the metal foil 1 (FIG. 1(c)). A resist 5 is applied onto the whole surface of the embossing-processed metal foil 1 (FIG. 1(d)). The whole surface of the resist 5 is exposed to light for a short time so as to make only surface portions 6 of the resist 5 soluble (FIG. 1(e)). The surface portions 6 which have been made soluble are removed (FIG. 1(f)), exposed metal portions 7 are etched (FIG. 1(g)) and at least resist portions 5a at image portions are removed (FIG. 1(h)). In use, the parting film is peeled and removed so as to use the anisotropic conductive adhesive member.

The above description has been made as to the example of the anisotropic conductive adhesive member. It will be apparent that the method according to the present invention can be used in manufacturing a flexible print substrate or a tape connector if, for example, a polyester film and a thermosetting adhesive agent are used instead of the parting film and the adhesive agent respectively.

The method of the present invention will be further specifically described through the following non-limiting examples.

A lamination of copper and polyester films (35 μm and 50 μm in thickness respectively) was passed through an embossing roll having a surface of silk texture pattern of 48 meshes to make the surface of the lamination uneven. A photoresist (Photosol 800-H-315: Tokyo OHKA KOGYO Co., Ltd.) was applied onto the whole surface by using a bar coater and dried, and thereafter the whole surface was exposed to light by using a high-pressure mercury-vapor lamp (JP-2000: OHKU SEISAKUSHO) for ten minutes.

After the exposure had been finished, soluble portions of the resist was removed by using a developer (PDS-1: Tokyo), etching is affected by using a solution of cupric chloride, and finally the remaining resist film portions at the picture portions were removed. The diameter of the obtained electric conductor was 250 through 300 μm.

EXAMPLE 2

A copper foil 20 μm in thickness was passed through an embossing roll having a surface of silk-mesh pattern of 100 meshes to make the surface of the copper foil uneven. After polyester resin (K-1294: Toray Industry, Inc.) had been applied to one of the opposite surfaces of the thus processed copper foil, the other surface was entirely coated with a photoresist. Then, an electric conductor formed on the polyester resin was obtained through the operating similar to the Example 1. The diameter of the thus obtained electric conductor was 120 through 180 μm.

The thus obtained one can be effectively used as an anisotropic conductive adhesive member.

EXAMPLE 3

Figure 2A:
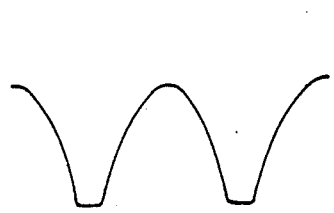
FIGS. 2(a)–(b) are schematic transverse cross-sectional views of after embossing (FIG. 1(e)).

Laminations composed of copper and polyester films (respectively 30 μm and 25 μm in thickness) available on the market were passed through an embossing roll of a linear pattern of 63.5 meshes under the embossing pressures of 50 Kg/cm and 125 Kg/cm respectively, so that unevenness was obtained on the whole surface of each of the copper/polyester laminations was measured by using a surface roughness measuring machine. The result of measurement is shown in FIGS. 2(a) and (b).

Figure 3A:
FIGS. 3(a)–(b) are schematic transverse cross-sectional views after etching and peeling of resists (FIG. 1(b)).
Figure 2B:
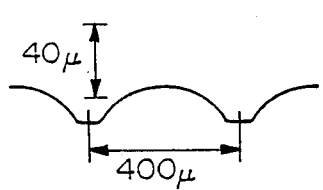
Figure 3B:
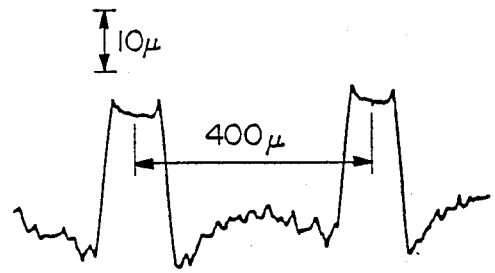

A photoresist was applied to each embossed surface and processed similarly to the Example 1, so that electric conductors having fine pitches were obtained on each polyester substrate. The surface of the thus obtained each conductor/polyester substrate was measured by using a surface roughness measuring machine. The result of measurement is shown in FIGS. 3(a) and (b). In the case of the embossing pressure of 125 Kg/cm, it is found that the electric conductor is sharply raised up at its opposite ends. The shape can be desirably changed by changing the time for the photoresist exposure or for the etching.

A tape connector of the thermocompression bonding type can be produced by applying an adhesive agent to the conductor side surface of the conductor/polyester obtained in the manner described above. Further, as will be apparent from FIGS. 3(a) and (b), in the conductor/polyester-substrate obtained under the embossing pressure of 125 Kg/cm, the conductor surface was formed to be lower than the concave portions of the polyester substrate, so that the conductor can be used also as a pressure-sensitive conductor.

As described above, in the method according to the present invention, a picture composed of concave surface portions can be continuously formed through embossing processing and resist exposure can be continuously performed.

In the case of forming a picture composed of concave portions through embossing processing, the shape of the metal picture is curved after completion of etching, so that, for example, in the case where the method according to the present invention is applied to the formation of metal particles of an anisotropic conductive adhesive member, there is such an advantage that a necessary pressure can be reduced when electrical connection between opposite members is formed by the use of the thus obtained anisotropic conductive adhesive member under application of heat and pressure thereto.

It is considered that the method according to the present invention can be effectively applied to the manufacturing of, for example, flexible print substrates, tape connectors, and anisotropic conductive adhesive members.

We claim:

1. A method of forming a metal image wherein a resist film is provided at an image portion and then an etching process is performed to thereby form the metal image comprising the steps of:
   (i) forming an image comprised of concave surface portions on a metal surface;
   (ii) forming a resist film on said metal surface;
   (iii) exposing the whole surface of said resist film to light to such an extent that the concave portions of said resist film are not made wholly soluble;
   (iv) removing the wholly soluble portions of said resist film selectively; and
   (v) processing the exposed metal portions through etching and removing said concave portions of said resist film at said image portion.

2. The method of claim 1 wherein said concave surface portions are formed on said metal surface by an embossing process.

* * * * *